United States Patent
Huang et al.

(10) Patent No.: US 10,693,009 B2
(45) Date of Patent: Jun. 23, 2020

(54) STRUCTURE OF S/D CONTACT AND METHOD OF MAKING SAME

(71) Applicant: Taiwan Semiconductor Manufacturing Company, Ltd., Hsin-Chu (TW)

(72) Inventors: Yu-Lien Huang, Hsinchu County (TW); Tung Ying Lee, Hsinchu (TW); Chun-Hsiang Fan, Taoyuan County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 16/266,454

(22) Filed: Feb. 4, 2019

(65) Prior Publication Data

US 2019/0181267 A1   Jun. 13, 2019

Related U.S. Application Data

(62) Division of application No. 14/460,438, filed on Aug. 15, 2014, now Pat. No. 10,199,502.

(51) Int. Cl.
| | | |
|---|---|---|
| *H01L 29/167* | (2006.01) | |
| *H01L 29/78* | (2006.01) | |
| *H01L 27/088* | (2006.01) | |
| *H01L 29/06* | (2006.01) | |
| *H01L 21/8234* | (2006.01) | |
| *H01L 29/66* | (2006.01) | |
| *H01L 29/417* | (2006.01) | |

(52) U.S. Cl.
CPC .. *H01L 29/7853* (2013.01); *H01L 21/823418* (2013.01); *H01L 21/823431* (2013.01); *H01L 27/0886* (2013.01); *H01L 29/0653* (2013.01); *H01L 29/41791* (2013.01); *H01L 29/6681* (2013.01); *H01L 29/66795* (2013.01); *H01L 29/7851* (2013.01); *H01L 2029/7858* (2013.01)

(58) Field of Classification Search
CPC ......... H01L 29/42392; H01L 29/78696; H01L 29/0673; H01L 29/785; H01L 29/66795; H01L 27/092; H01L 29/66439; H01L 29/775

See application file for complete search history.

(56) References Cited

U.S. PATENT DOCUMENTS

| | | | |
|---|---|---|---|
| 8,994,108 B2 | 3/2015 | Chang et al. | |
| 9,184,269 B2* | 11/2015 | Ching | H01L 21/823821 |
| 9,406,804 B2 | 8/2016 | Huang et al. | |
| 9,496,263 B1* | 11/2016 | Ando | H01L 27/0922 |

(Continued)

*Primary Examiner* — Bradley Smith
*Assistant Examiner* — David J Goodwin
(74) *Attorney, Agent, or Firm* — Haynes and Boone, LLP

(57) ABSTRACT

A semiconductor device includes a fin feature in a substrate, a stack of semiconductor layers over the fin feature. Each of the semiconductor layers does not contact each other. The device also includes a semiconductor oxide layer interposed between the fin feature and the stack of the semiconductor layers. A surface of the semiconductor oxide layer contacts the fin feature and an opposite surface of the semiconductor oxide layer contacts a bottom layer of the stack of semiconductor layers. The device also includes a conductive material layer encircling each of the semiconductor layers and filling in spaces between each of two semiconductor layers.

21 Claims, 9 Drawing Sheets

(56) References Cited

U.S. PATENT DOCUMENTS

| | | | |
|---|---|---|---|
| 9,590,038 B1* | 3/2017 | Kim | H01L 29/42392 |
| 9,660,033 B1* | 5/2017 | Chen | H01L 29/1054 |
| 10,032,627 B2* | 7/2018 | Lee | H01L 29/0649 |
| 2010/0163971 A1* | 7/2010 | Hung | H01L 29/66795 |
| | | | 257/327 |
| 2010/0295021 A1* | 11/2010 | Chang | H01L 27/1203 |
| | | | 257/24 |
| 2011/0031473 A1* | 2/2011 | Chang | B82Y 10/00 |
| | | | 257/24 |
| 2013/0020640 A1* | 1/2013 | Chen | H01L 29/66795 |
| | | | 257/347 |
| 2013/0161756 A1* | 6/2013 | Glass | H01L 29/66545 |
| | | | 257/369 |
| 2013/0234215 A1* | 9/2013 | Okano | H01L 29/42392 |
| | | | 257/255 |
| 2014/0001441 A1 | 1/2014 | Kim et al. | |
| 2014/0001520 A1* | 1/2014 | Glass | H01L 29/66439 |
| | | | 257/288 |
| 2014/0061862 A1* | 3/2014 | Vega | H01L 21/3081 |
| | | | 257/616 |
| 2014/0091279 A1* | 4/2014 | Kachian | B82Y 10/00 |
| | | | 257/27 |
| 2014/0151638 A1 | 6/2014 | Chang et al. | |
| 2014/0197377 A1 | 7/2014 | Kim et al. | |
| 2014/0209855 A1 | 7/2014 | Cea et al. | |
| 2014/0353574 A1 | 12/2014 | Li et al. | |
| 2015/0295089 A1 | 10/2015 | Huang et al. | |
| 2016/0049516 A1 | 2/2016 | Huang et al. | |

\* cited by examiner

STRUCTURE OF S/D CONTACT AND METHOD OF MAKING SAME

PRIORITY DATA

The present application is a divisional application of U.S. application Ser. No. 14/460,438, filed on Aug. 15, 2014, which is hereby incorporated by reference in its entirety. This application is related to patent application U.S. Ser. No. 14/250,763 filed on Apr. 11, 2014, as "FinFETs with Contact-All-Around", the entire disclosure of which is hereby incorporated by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of fabricating FinFET devices have been generally adequate for their intended purposes, they have not been entirely satisfactory in all respects. For example, a reduced resistance of source/drain contact is desired.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
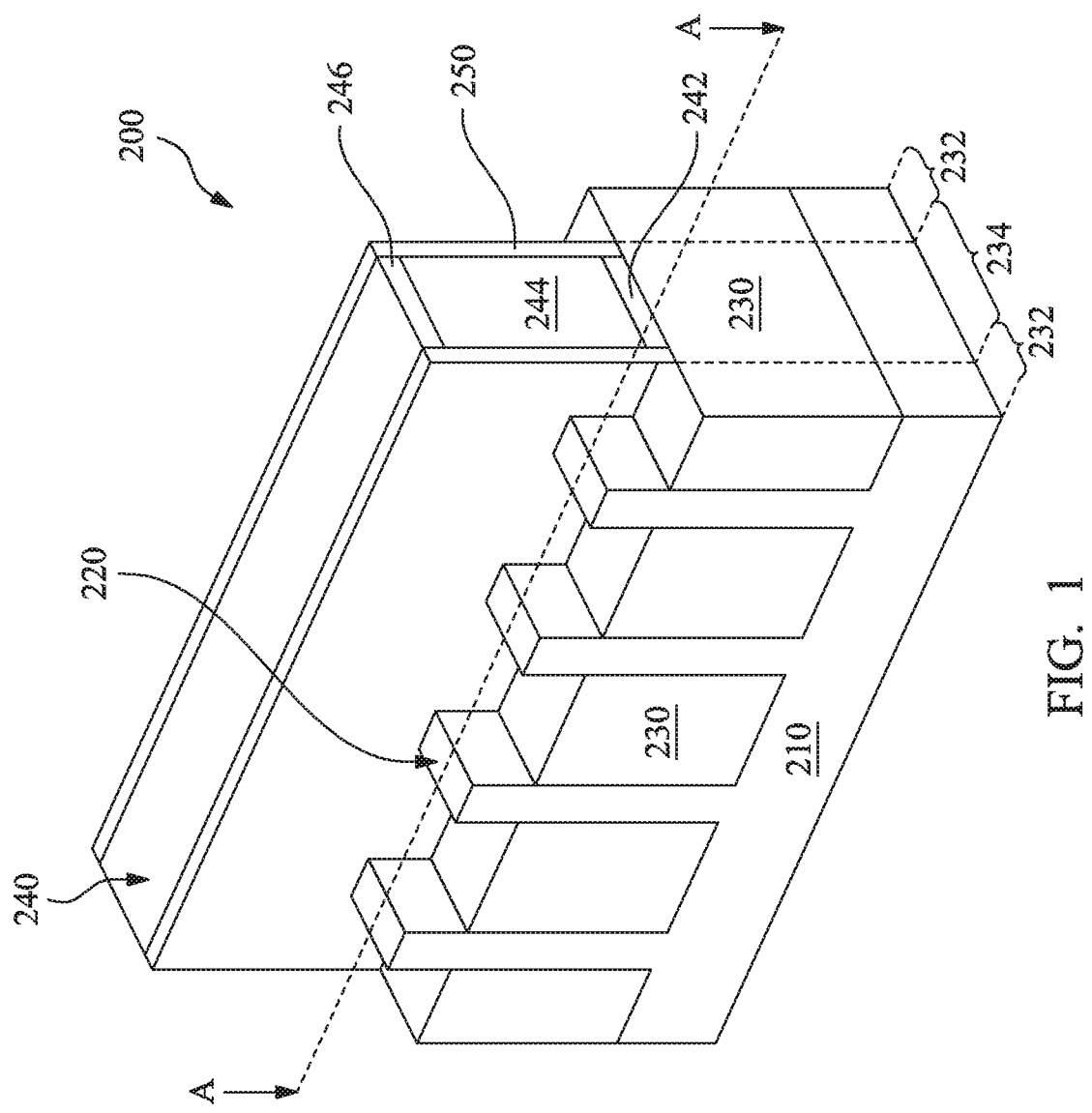
FIG. 1 is a diagrammatic perspective view of an example semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIGS. 1 through 8 are perspective views and cross-sectional views of intermediate stages in the manufacturing of a semiconductor device 200 in accordance with some example embodiments. FIG. 1 illustrates a perspective view of an initial structure. The initial structure includes a substrate 210. Substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors 200, the insulator layer is a component (e.g., layer) of a silicon-on-insulator substrate.

The substrate 210 may also include various doped regions. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

A fin feature 220 is formed on the substrate 210. In some embodiments, the substrate 210 includes more than one fin feature 220. The fin feature 220 is formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure into the substrate 210. The area not protected by the masking element is etched using reactive ion etching (RIE) processes and/or other suitable processes. In an example, the fin feature 220 is formed by patterning and etching a portion of the silicon substrate 210. In another example, the fin feature 220 is formed by patterning and etching a silicon layer deposited overlying an insulator layer (for example, an upper silicon layer of a silicon-insulator-silicon stack of an SOI substrate. It is understood that multiple parallel fin features 220 may be formed in a similar manner.

Various isolation regions 230 are formed on the substrate 210 to isolate active regions. For example, the isolation regions 230 separate fin features 220. The isolation region 230 may be formed using traditional isolation technology, such as shallow trench isolation (STI), to define and electrically isolate the various regions. The isolation region 230 includes silicon oxide, silicon nitride, silicon oxynitride, an air gap, other suitable materials, or combinations thereof. The isolation region 230 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide. In one embodiment, a chemical mechanical polishing (CMP) process is performed to remove excessive dielectric materials and planarize the top surface of the isolation regions 230 with the top surface of the fin feature 220. Additionally, the CMP process removes the first hard mask as well.

In some embodiments, the substrate 210 has source/drain regions 232 and a gate region 234. In some embodiments, a source/drain region 232 is a source region, and another source/drain region 232 is a drain region. The source/drain regions 232 are separated by the gate region 234.

One or more dummy gate stacks 240 are formed over in the gate region 234 in the substrate 210, including over a portion of the fin features 220. The dummy gate stacks 240 are to be replaced later by a high-k (HK) and metal gate (MG) after high thermal temperature processes are performed, such as thermal processes during sources/drains formation. The dummy gate stack 240 may include the dielectric layer 242, the polysilicon layer 244 and the hard mask 246. The dummy gate stack 240 is formed by any suitable process or processes. For example, the dummy gate stack 240 can be formed by a procedure including deposition, photolithography patterning, and etching processes. The deposition processes include chemical vapor deposition (CVD), physical vapor deposition (PVD), atomic layer deposition (ALD), other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). The dielectric layer 242 includes silicon oxide, silicon nitride, or any other suitable materials. The hard mask 246 includes any suitable material, for example, silicon nitride, silicon oxynitride and silicon carbide.

Sidewall spacers 250 may be formed along the dummy gate stacks 240. The sidewall spacers 250 may include a dielectric material such as silicon oxide, silicon nitride, silicon carbide, silicon oxynitride, or combinations thereof. Typical formation methods for the sidewall spacers 250 include depositing a dielectric material over the gate stack and then anisotropically etching back the dielectric material. The etching back process may include a multiple-step etching to gain etch selectivity, flexibility and desired overetch control.

Figure 2:
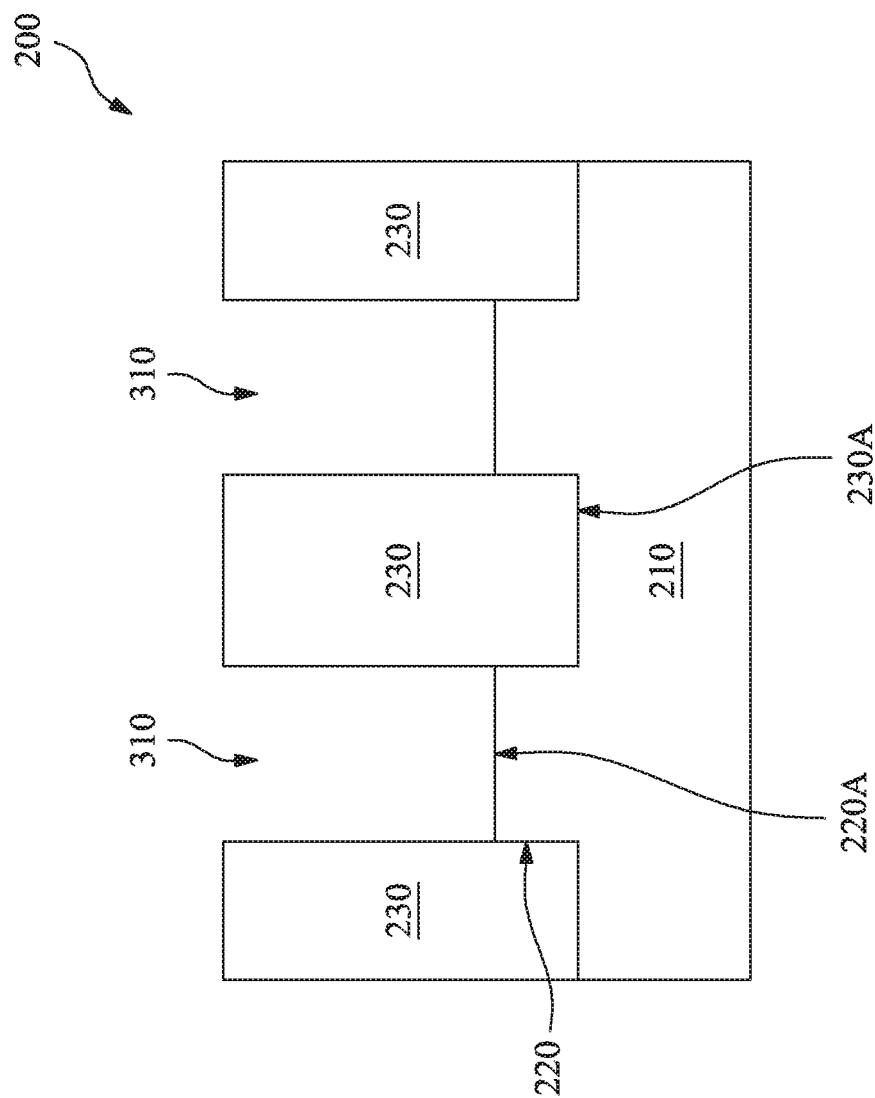
FIGS. 2-4 are cross-sectional views of an example semiconductor device along the line A-A in FIG. 1.

FIG. 2 illustrates a cross-section view of the semiconductor device 200 along line A-A in the S/D region 232 in FIG. 1 after Fin features 220 are recessed and S/D trenches 310 are formed. In one embodiment, prior to recessing process, a patterned hard mask is formed over the substrate 210 to protect predetermined regions, such as P-type FET region, or an N-type FET region. The hard mask layer may be formed by deposition, patterning and etching process. The fin features 220 are then recessed through the patterned hard mask. In one embodiment, a depth of the recess is controlled that a top surface 220A of the recessed fin feature 220 is above a bottom surface 230A of the isolation region 230, as shown in FIG. 2.

Figure 3:
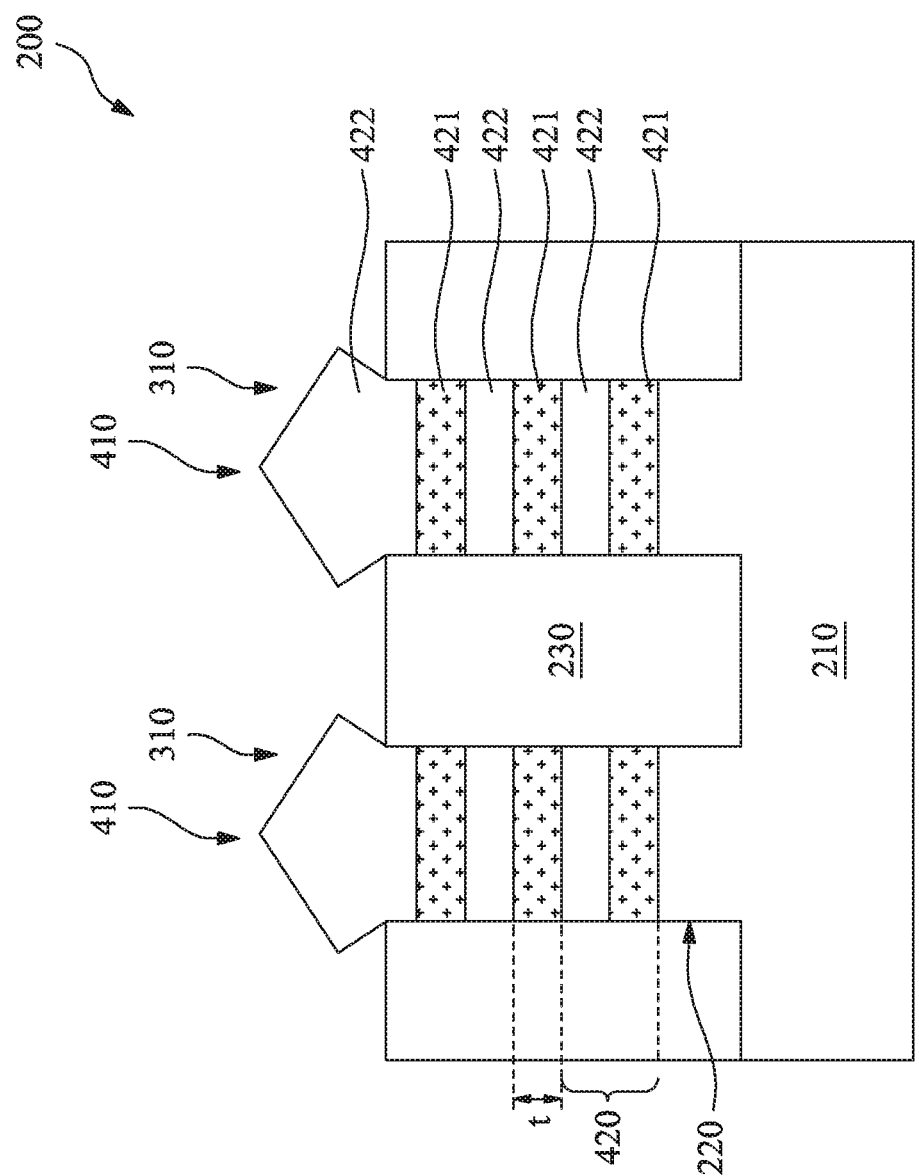

FIG. 3 illustrates pre-S/D stacks 410 are formed over the recessed fin features 220. In the present embodiment, the pre-S/D stack 410 may include one or more pairs 420 of a first semiconductor layer 421 and a second semiconductor layer 422. Each layer of the pre-S/D stack 410 vertically aligns with the fin feature 220. The first and second semiconductor layers, 421 and 422, are different from each other. The first semiconductor layer 421 has a different material or composition to the second semiconductor layer 422 to obtain a different etch rate in a subsequent etch process. Throughout the description, when the first semiconductor layer 421 is referred to as having a composition different from the composition of the second semiconductor layer 422, it indicates that either one of the first semiconductor layer 421 and the second semiconductor layer 422 has an element not in the other layer, and/or one or more element that appears in both the first semiconductor layer 421 and the second semiconductor layer 422 has an atomic percentage in one of the first and the second layers, 421 and 422, different from the atomic percentage of the same element in the other layer.

As an example, the first semiconductor layer 421 includes silicon germanium (SiGe) and the second semiconductor layer 422 includes silicon. In various examples, the first and the second semiconductor layers, 421 and 422, may include germanium (Ge), silicon (Si), gallium arsenide (GaAs), aluminum gallium arsenide (AlGaAs), silicon germanium (SiGe), gallium arsenide phosphide (GaAsP), or other suitable materials. In some embodiment, the second semiconductor layer 422 in different pair 420 may have the same composition. Alternatively, the second semiconductor layers in different pair 420 may have different compositions.

The pre-S/D stack 410 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes. After the S/D trenches 310 are filled with the pre-S/D stack 410, the further epitaxial growth of the top layer of the pre-S/D stack 410 expands horizontally and facets may start to form, such as a diamond shape facets, as shown in FIG. 3. The second semiconductor layer 422 may be in-situ doped during the epi processes. For example, in one embodiment, the second semiconductor layer 422 includes an epitaxially grown SiGe layer that is doped with boron. In another embodiment, the second semiconductor layer 422 includes an epitaxially grown Si epi layer that is doped with carbon. In yet another embodiment, the second semiconductor layer 422 includes an epitaxially grown Si epi layer 4 that is doped with phosphorous. In one embodiment, the second semiconductor layer 422 is not in-situ doped, an implantation process (i.e., a junction implant process) is performed to dope the second semiconductor layer 422.

Figure 4:
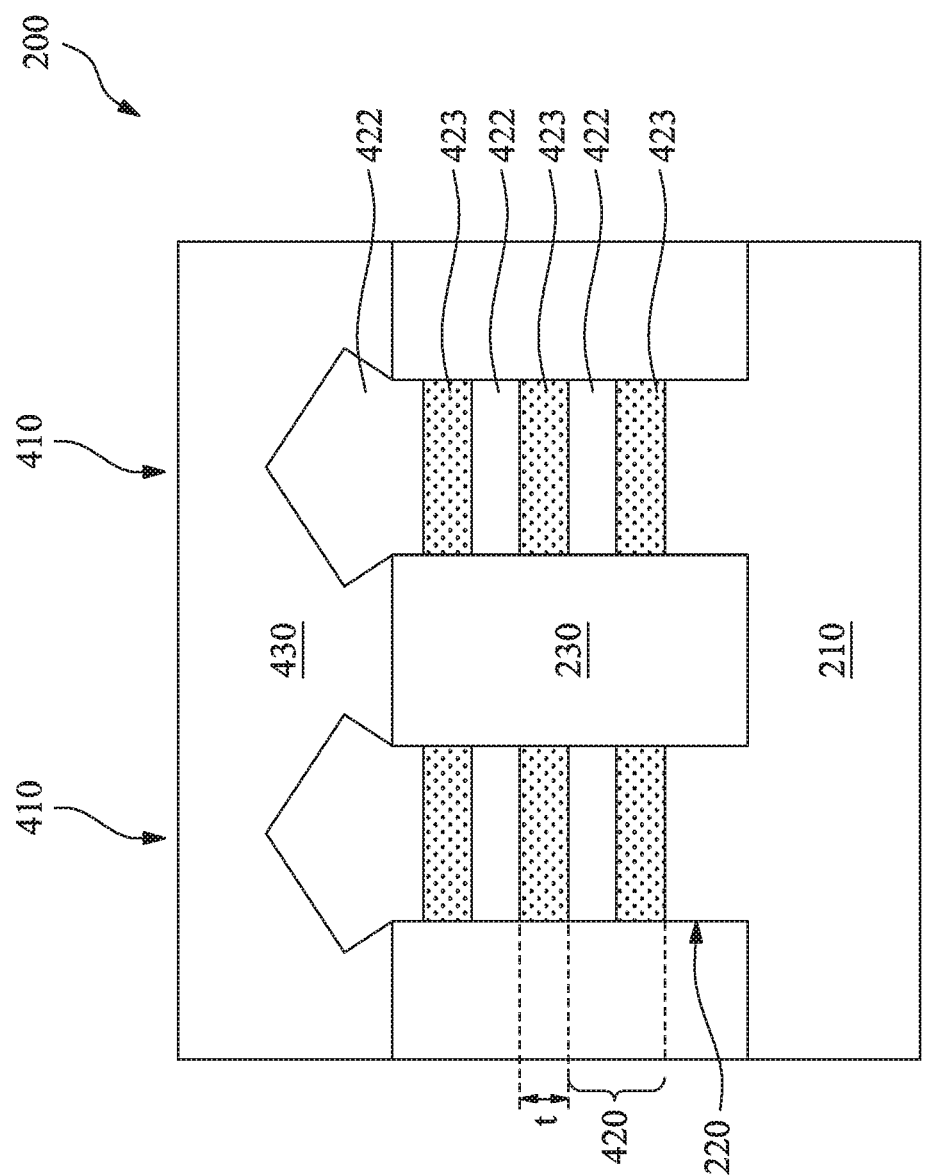

FIG. 4 illustrates the first semiconductor layers 421 are converted to respective semiconductor oxide layers 423. In one embodiment, an annealing process is applied to convert the first semiconductor material layers 421 to the semiconductor oxide layers 423. In the present embodiment, the thermal oxidation process is controlled such that the first semiconductor material layer 421 oxidizes much faster that the second semiconductor layers 422, so the second semiconductor material layers remain intact. In one embodiment, the SiGe layer 421 is converted the silicon germanium oxide (SiGeO) layer 423.

An interlayer dielectric (ILD) layer 430 may be formed on the substrate 210, including between the dummy gate stacks 240. The ILD layer 430 may include silicon oxide, silicon nitride, a dielectric material having a dielectric constant (k) lower than thermal silicon oxide (therefore referred to as low-k dielectric material layer), or other suitable dielectric material layer. The ILD layer 430 includes a single layer or multiple layers. A chemical mechanical polishing (CMP) process may be performed to remove excessive ILD layer 610 and planarize the top surface of the ILD layer 430.

Figure 5:
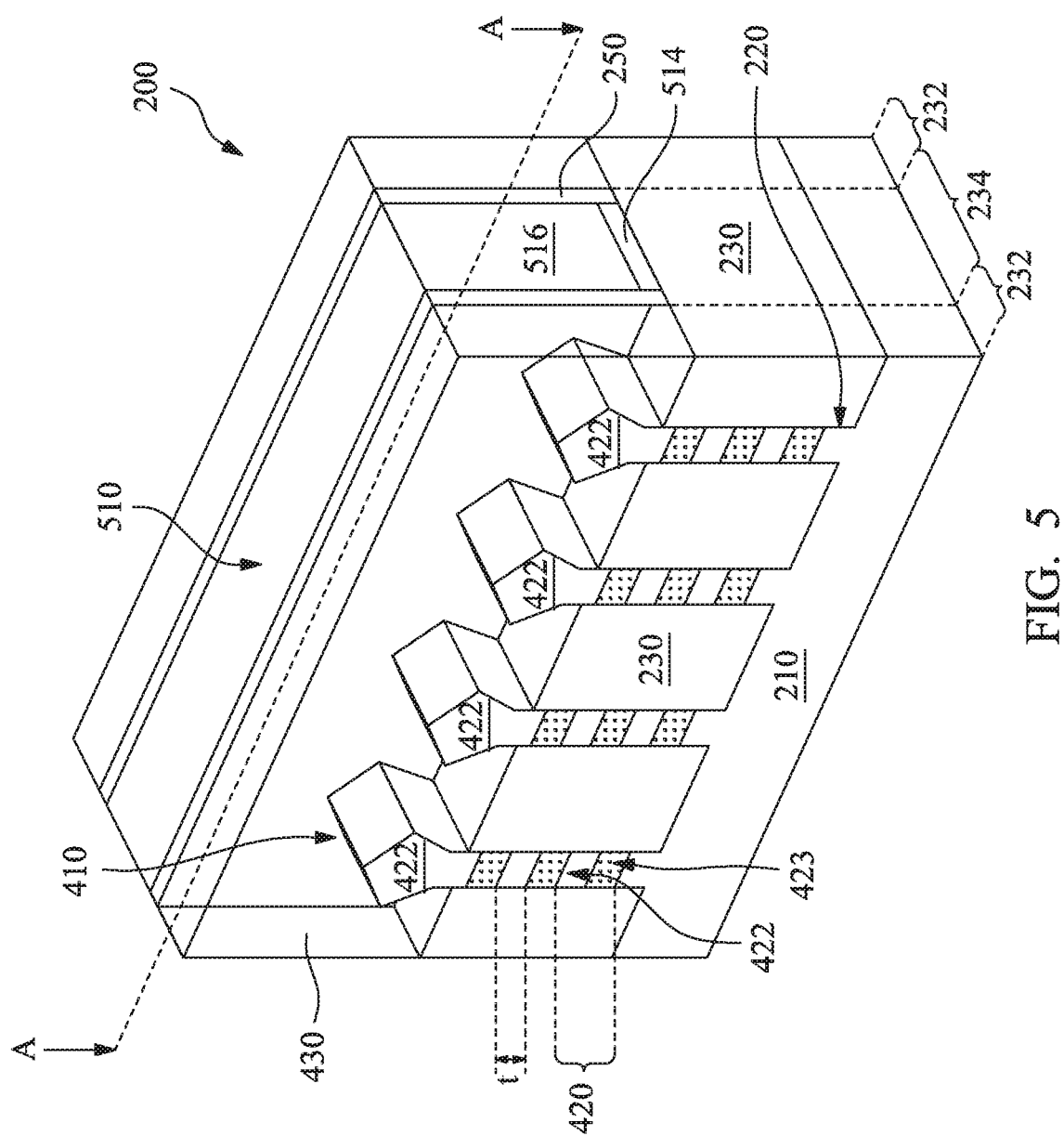
FIG. 5 is a diagrammatic perspective view of an example semiconductor device in accordance with some embodiments.

FIG. 5 illustrates a high-k/metal gate (HI/MG) 510 that replaces the dummy gate stack 240. The HK/MG 510 include gate dielectric layer 514 and gate electrode 516 over the gate dielectric. The gate dielectric layer may include an interfacial layer (IL) and a HK dielectric layer deposited on the IL. The IL may include oxide, HfSiO and oxynitride. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The MG electrodes 516 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 516 may include Ti, Ag, Al, TiAlN, TaC, TaCN, TaSiN, Mn, Zr, TiN, TaN, Ru, Mo, Al, WN, Cu, W, any suitable materials or a combination thereof. A CMP process may be performed to remove excessive MG electrode 516.

Figure 6:
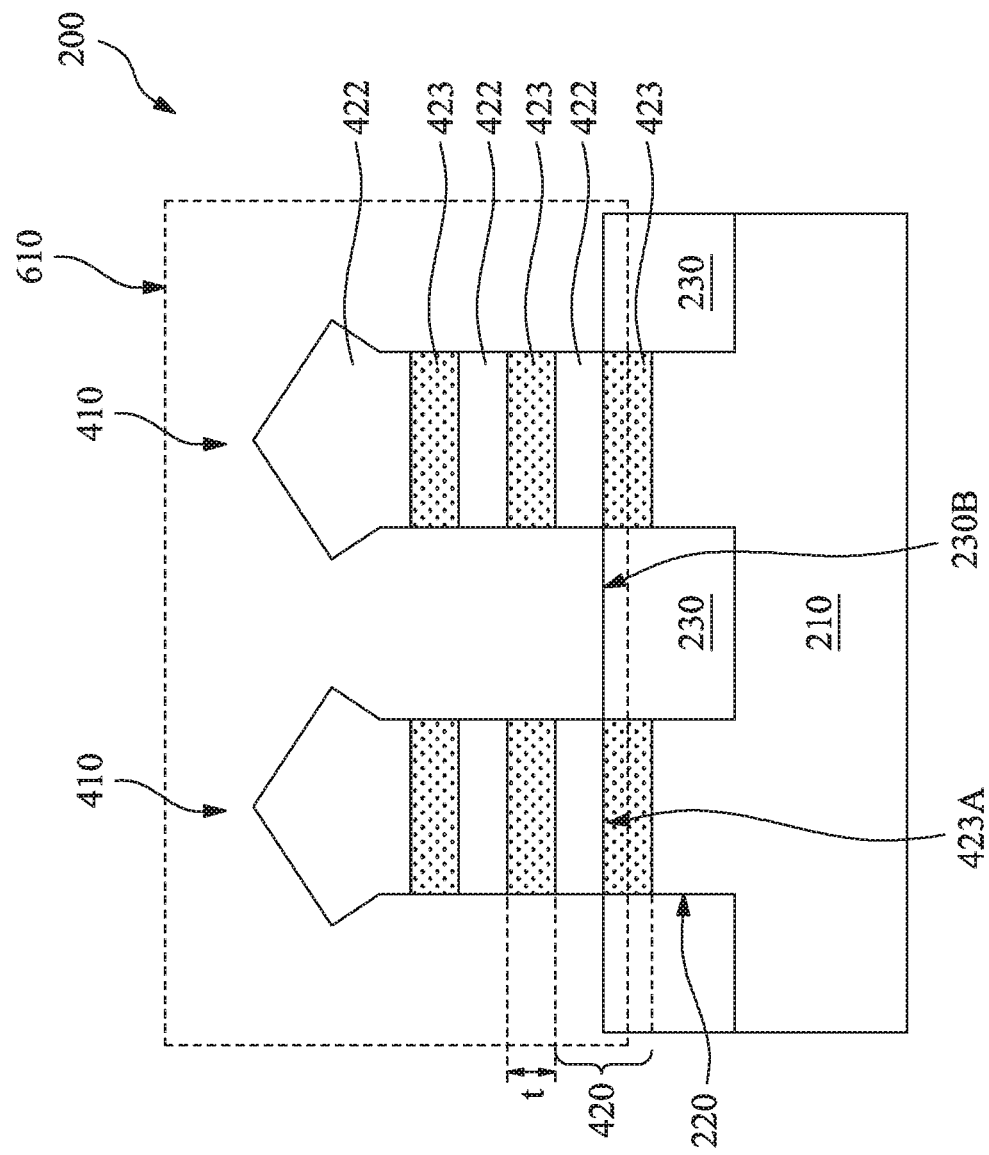
FIGS. 6-8 are cross-sectional views of an example semiconductor device along the line A-A in FIG. 5.

FIG. 6 illustrates a contact opening 610 formed over the substrate 210 by removing the ILD layer 430 and extending to recess the isolation region 230 such that an upper portion of the pre-S/D stacks 410 are laterally exposed while a bottom portion of the pre-S/D stacks 410 are embedded in the isolation region 230. In the present embodiment, the embedded bottom portion includes at least one of the semiconductor oxide layers 423. In another words, the isolation region 230 is recessed such that its top surface 230B is same or above a top surface 423A of the first of semiconductor oxide layer 423 (from bottom of the pre-S/D stack 410). For the sake of better description, the embedded semiconductor oxide layer 423 is named with a reference number 425. In one embodiment, more than one pre-S/D stacks 410 are exposed in one contact opening 610. In another embodiment, a single pre-S/D stack 410 is exposed in one contact opening 610.

Figure 7:
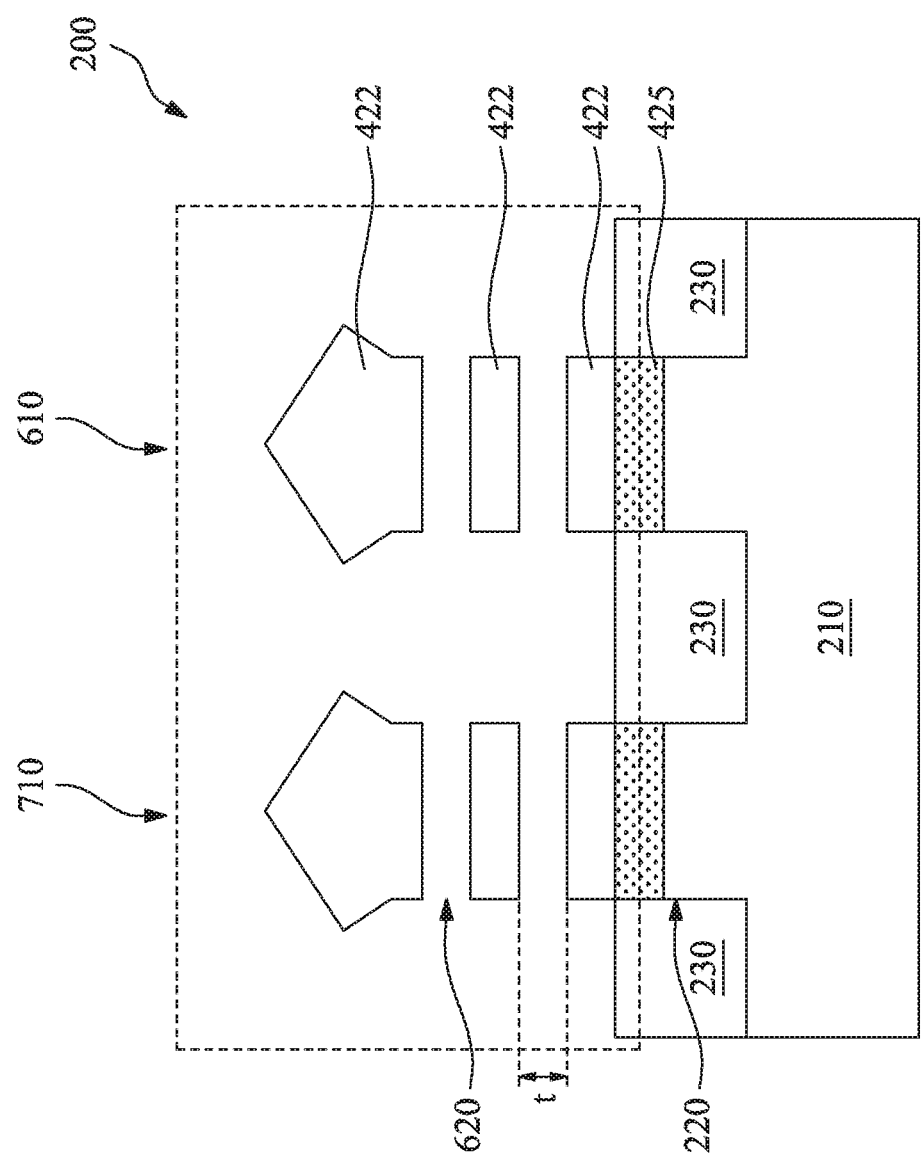

FIG. 7 illustrates S/D stacks 710 are formed by removing the semiconductor oxide layer 423 from the exposed pre-S/D stack 410, while the second semiconductor layers 422 remain intact. Thus two adjacent the semiconductor layers 422, are separated from each other by spaces 620. In the present embodiment, being protected by the second semiconductor layer 422 and the isolation region 230, the semiconductor oxide layer 425 remains intact as well.

As a result of the etching, the S/D stack 710 is formed with a stack of the second semiconductor layers 422. Each of the second semiconductor layers does not contact each other and they are separated by spaces 620. A width of the space 620 is as same as the thickness t of the removed semiconductor oxide layer 423. In the present embodiment, the S/D stack 710 is separated from the recessed fin 220 by the semiconductor oxide layer 425, which reduces junction leakage. The semiconductor oxide layer 425 has a same width as the fin feature 220 and vertically aligns to the fin feature 220.

Figure 8:
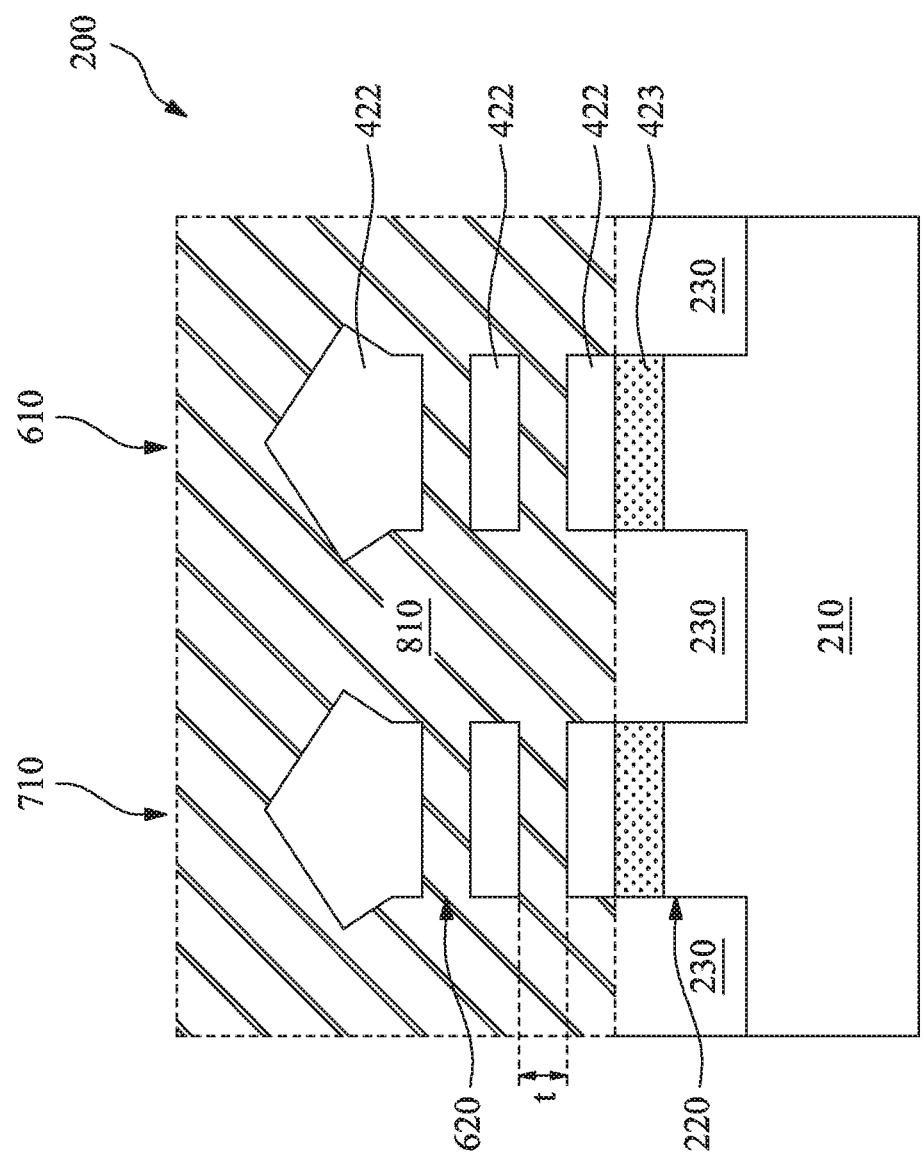

FIG. 8 illustrates a material layer 810 is filled in the contact opening 610, including encircling each of the second semiconductor layer 422 and filling in the space 620. Therefore, contact areas between the material layer 810 and the S/D stack 710 is enlarged. In one embodiment, the material layer 810 is a conductive material, such as copper (Cu), aluminum (Al), tungsten (W), copper or copper alloy, such as copper magnesium (CuMn), copper aluminum (CuAl) or copper silicon (CuSi), or other suitable conductive material. In one embodiment, the conductive material layer 810 includes a multiple layers, such as a barrier layer is formed prior to depositing a metal layer to prevent diffusion and/or provide material adhesion. The barrier layer may include titanium nitride (TiN), tantalum nitride (TaN), tungsten nitride (WN), titanium silicon nitride (TiSiN) or tantalum silicon nitride (TaSiN). With enlarged contact area between the conductive material layer 810 and the S/D stack 910, S/D contact resistance is reduced.

Figure 9:
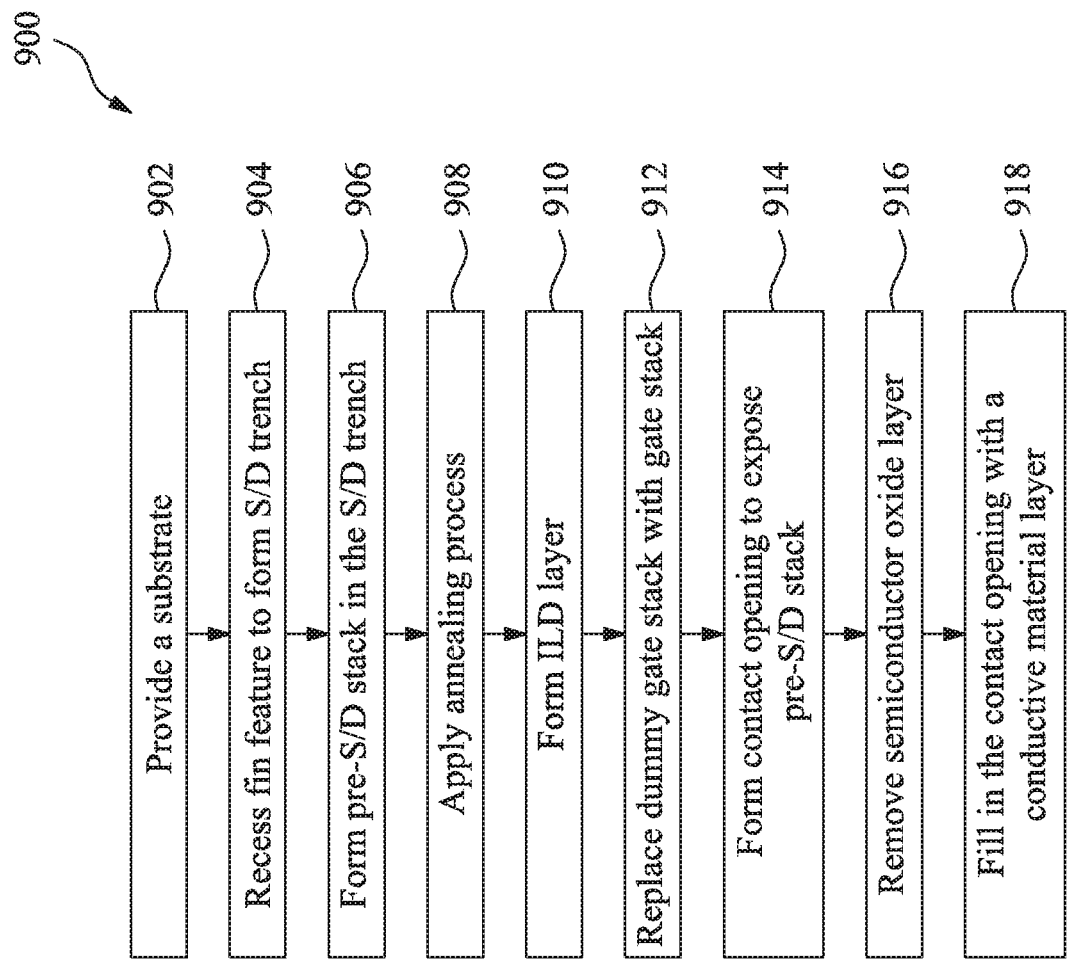
FIG. 9 is a flow chart of an example method for fabricating a semiconductor device in accordance with some embodiments.

The present disclosure also provides various methods for fabricating a semiconductor device. FIG. 9 is a flowchart of a method 900 for fabricating the semiconductor device 200 (in FIG. 8 in the present embodiment). Referring to FIGS. 9 and 1, the method 900 starts at step 902 by providing the substrate 210 having the fin feature 220, the dummy gate stack 240 and the gate spacer 225 along sidewalls of the dummy gate stack 240.

Referring to FIGS. 9 and 2, the method 900 proceeds to step 904 by recessing the fin feature 220 in the S/D region 232 to form the S/D trench 310. The recessing process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Referring to FIGS. 9 and 3, the method 900 proceeds to step 906 by forming the pre-S/D stacks 410 in the S/D trenches 310. The pre-S/D stack 410 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes. In one embodiment, an in-situ doping process may be performed during the epi processes. In another embodiment, an implantation process (i.e., a junction implant process) is performed to dope the pre-S/D stack 410. One or more annealing processes may be performed to activate dopants. The annealing processes comprise rapid thermal annealing (RTA) and/or laser annealing processes.

Referring to FIGS. 9 and 4, the method 900 proceeds to step 908 by applying an annealing process to covert the first semiconductor material layer 421 to the semiconductor oxide layer 423. In one embodiment, the annealing process is conducted in oxygen ambient. In another embodiment, the annealing process is conducted in a combination of steam ambient and oxygen ambient. As an example, the annealing process is performed in a $H_2O$ reaction gas with a temperature ranging from about 400° C. to about 600° C. and under a pressure ranging from about 1 atm. to about 20 atm.

Referring again to FIGS. 9 and 4, the method 900 proceeds to step 910 by forming the ILD layer 430 over the substrate 210. The ILD layer 430 may be deposited by CVD, PV), ALD), spin-on, and/or other suitable processes. A CMP process may be performed to remove excessive ILD layer 430 and planarize the top surface of the ILD layer 430 with the dummy gate stack 240.

Referring to FIGS. 9 and 5, the method 900 proceeds to step 912 by replacing the dummy gate stack 240 with the gate stack 510. First, the dummy gate stack 240 is removed to form a gate trench. In one embodiment, the dummy gate stack 240 is removed by a selective wet etch, or a selective dry etch. In another embodiment, the dummy gate stack 240 is removed by lithography patterning and etching processes. The gate dielectric layer 514 is then deposited over the gate trench. The gate dielectric layer 514 may be deposited by a suitable method, such as ALD, CVD, thermal oxidation or ozone oxidation, metal-organic CVD (MOCVD), PVD, other suitable technique, or a combination thereof. The MG electrode 516 may be formed by ALD, PVD, CVD, or other suitable process. Another CMP process may be performed to remove excessive gate dielectric layer 514 and the MG electrode 516.

Referring to FIGS. 9 and 6, the method 900 proceeds to step 914 by forming the contact opening 610 and exposing the upper portion of the pre-S/D stack 410 in the contact opening 610. The contact opening 610 is formed by a procedure including patterning and etching processed. In one embodiment, a contact hard mask is formed over the substrate with openings, and the ILD layer 430 and the isolation region 230 are etched through the contact hard mask. The etching process may include a dry etching process, a wet etching process, and/or a combination of.

Referring to FIGS. 9 and 7, the method 900 proceeds to step 916 by removing the semiconductor oxide layers 423 in the exposed upper portion of the pre-S/D stack 410 and forming spaces 620. The etching process may include a selective wet etch, such as a diluted HF etch, or a diluted HCL etch. The etching selectively removes the semiconductor oxide layer 423 but does not substantially the second semiconductor layer 422.

Referring to FIGS. 9 and 8, the method 900 proceeds to step 918 by filling in the contact opening 610 with the material layer 810, including encircling each of the second semiconductor layer 422. In one embodiment, the metal layer 810 may be deposited by PVD, CVD, metal-organic chemical vapor deposition (MOCVD), or plating.

Additional steps can be provided before, during, and after the method 900, and some of the steps described can be replaced, eliminated, or moved around for additional embodiments of the method 900.

The semiconductor device 200 may include additional features, which may be formed by subsequent processing. For example, various vias/lines and multilayer interconnect features (e.g., metal layers and interlayer dielectrics) may be formed over the substrate, configured to connect the various features or structures of the devices 200.

Based on the above, it can be seen that the present disclosure offers a structure of S/D stack, S/D contact and a method for fabricating it. The S/D stack is formed by a multiple of semiconductor layers, which does not contact to each other. The S/D stack is isolated from the fin feature by a semiconductor oxide layer to reduce leakage. The S/D contact is formed by encircling each of the semiconductor layers with a conductive material layer, including filling in the space between each of them, to enlarge contact area between the conductive material layer and the S/D stack, which reduces contact resistance.

The present disclosure provides many different embodiments of a semiconductor device. The semiconductor device includes a fin feature in a substrate, a stack of semiconductor layers over the fin feature. Each of the semiconductor layers does not contact each other. The device also includes a semiconductor oxide layer interposed between the fin feature and the stack of the semiconductor layers. A surface of the semiconductor oxide layer contacts the fin feature and an opposite surface of the semiconductor oxide layer contacts a bottom layer of the stack of semiconductor layers. The device also includes a conductive material layer encircling each of the semiconductor layers and filling in spaces between each of two semiconductor layers.

In another embodiment, a semiconductor device includes a fin feature over a substrate, a source and drain (S/D) feature over the fin feature. The S/D feature includes a stack of semiconductor layers over a substrate and each of the semiconductor layers does not contact each other. The device also includes a semiconductor oxide layer interposed between the fin feature and the S/D feature. Thus a surface of the semiconductor oxide layer contacts the fin feature and an opposite surface of the semiconductor oxide layer contacts a bottom layer of the stack of semiconductor layers. The device also includes a metal layer encircling each of the semiconductor layers of the S/D feature and filling in spaces between each of two semiconductor layers.

In yet another embodiment, a method for fabricating a semiconductor device includes receiving a substrate. The substrate includes a fin feature formed by a portion of the silicon substrate, isolation regions between each of the fin feature, a dummy gate stack in a portion of the fin feature and a gate spacer along sidewalls of the dummy gate stack. The method also includes recessing portions of the fin feature, beside the dummy gate stack, to form source/drain (S/D) trenches, forming pre-S/D stacks in the S/D trenches. The pre-S/D stack includes one or more pairs of a first semiconductor layer and a second semiconductor layer. The method also includes applying an annealing process to convert the first semiconductor layer to a semiconductor oxide layer, forming an interlayer dielectric (ILD) layer over the substrate, replacing the dummy gate with a high-k/metal gate (HK/MG), forming a contact opening to expose a portion of the pre-S/D stack, including exposing the semiconductor oxide layer. The method also includes selectively removing the exposed semiconductor oxide layer to form a space between each of the first semiconductor layer and filling in the contact opening with a metal layer, including filling in the space between each of the first semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin structure on a substrate;
   forming a first semiconductor layer over the first fin structure;
   forming a second semiconductor layer over the first semiconductor layer, the second semiconductor layer being formed of a different material than the first semiconductor layer;
   forming a third semiconductor layer over the first fin structure, the third semiconductor layer being formed of the same material as the first semiconductor layer and physically contacting the first fin structure;
   performing a treatment process on the first semiconductor layer, wherein the performing of treatment process on the first semiconductor layer includes performing the treatment process on the third semiconductor layer;
   removing the treated first semiconductor layer, wherein after the removing of the treated first semiconductor layer, the treated third semiconductor layer is still disposed over the first fin structure; and
   forming a conductive material on the second semiconductor layer after the removing of the treated first semiconductor layer.

2. The method of claim 1, wherein the second semiconductor layer is part of a source/drain feature.

3. The method of claim 1, further comprising:
   forming a gate stack including a first gate electrode over the first fin structure; and
   removing the first gate electrode from the gate stack after performing the treatment process on the first semiconductor layer and prior to removing the treated first semiconductor layer.

4. The method of claim 1, wherein the performing of the treatment process on the first semiconductor layer includes performing an annealing process to oxidize the first semiconductor layer.

5. The method of claim 1, further comprising forming a fourth semiconductor layer over the second semiconductor layer, the fourth semiconductor layer being formed of the same material as the first semiconductor layer, and
   wherein the performing of treatment process on the first semiconductor layer includes performing the treatment process on the fourth semiconductor layer, and
   wherein the removing of the treated first semiconductor layer includes removing the treated fourth semiconductor layer.

6. The method of claim 1, further comprising forming a third semiconductor layer over the first fin structure, the third semiconductor layer being formed of the same material as the first semiconductor layer and physically contacting the first fin structure,
   wherein the performing of treatment process on the first semiconductor layer includes performing the treatment process on the third semiconductor layer, and
   wherein after the removing of the treated first semiconductor layer, the treated third semiconductor layer is still disposed over the first fin structure.

7. The method of claim 1, further comprising:
   forming a second fin structure over on the substrate;
   wherein the forming of the first semiconductor layer over the first fin structure includes forming the first semiconductor layer over the second fin structure,
   wherein the forming of the second semiconductor layer over the first semiconductor layer includes forming the second semiconductor layer over the second fin structure, and
   wherein the conductive material extends from the second semiconductor layer over the first fin structure to the second semiconductor layer over the second fin structure.

8. The method of claim 1, wherein the performing of the treatment process on the first semiconductor layer includes oxidizing the first semiconductor layer;
   wherein removing the treated first semiconductor layer includes removing the oxidized first semiconductor layer to expose a bottom surface of the second semiconductor layer, the bottom surface of the second semiconductor layer facing the substrate, and
   wherein forming the conductive material on the second semiconductor layer includes forming the conductive material directly on the bottom surface of second semiconductor layer.

9. The method of claim 1, wherein the conductive material includes a metal material.

10. A method comprising:
    forming a fin structure on a substrate, the fin structure having a gate region and source/drain region;
    forming a gate structure over the gate region of the fin structure;
    forming a first semiconductor layer over the source/drain region of the fin structure;
    forming a second semiconductor layer over the first semiconductor layer in the source/drain region of the fin structure, the second semiconductor layer being formed of a different material than the first semiconductor layer;
    forming a third semiconductor layer over the second semiconductor layer in the source/drain region of the fin structure, the third semiconductor layer being formed of the same material as the first semiconductor layer;

oxidizing the first and third semiconductor layers;

removing the oxidized third semiconductor layer; and forming a conductive material on the second semiconductor layer after the removing of the oxidized third semiconductor layer.

11. The method of claim 10, further comprising recessing the fin structure in the source/drain region prior to forming the first semiconductor layer over the fin structure in the source/drain region.

12. The method of claim 10, wherein the removing of the oxidized third semiconductor layer includes removing the oxidized first semiconductor layer.

13. The method of claim 10, wherein the oxidized first semiconductor layer is positioned under the second semiconductor layer while the forming of the conductive material on the second semiconductor layer occurs.

14. The method of claim 10, further comprising forming a fourth semiconductor layer over the third semiconductor layer in the source/drain region of the fin structure, the fourth semiconductor layer being formed of the same material as the second semiconductor layer, and
wherein the forming of the conductive material on the second semiconductor layer after the removing of the oxidized third semiconductor layer includes forming the conductive material on the fourth semiconductor layer such that the conductive material extends continuously form the second semiconductor layer to the fourth semiconductor layer.

15. The method of claim 10, further comprising forming a shallow trench isolation structure within the substrate, and
wherein the forming of the conductive material on the second semiconductor layer includes forming the conductive material directly on the second semiconductor layer and the shallow trench isolation structure.

16. The method of claim 10, wherein the first semiconductor layer includes SiGe and the second semiconductor layer includes Si.

17. The method of claim 10, wherein the gate structure includes a polysilicon gate electrode, the method further comprising:
removing the polysilicon gate electrode from the gate structure to form a trench after oxidizing the first and third semiconductor layers; and
forming a metal gate electrode in the trench prior to removing the oxidized third semiconductor layer.

18. A method for fabricating a semiconductor device, the method comprising:
receiving a substrate, the substrate including:
a fin feature formed by a portion of the silicon substrate;
isolation regions between each of the fin feature;
a dummy gate stack in a portion of the fin feature; and
a gate spacer along sidewalls of the dummy gate stack;
recessing portions of the fin feature, beside the dummy gate stack, to form a source/drain (S/D) trench;
forming pre-S/D stack in the S/D trench, wherein the pre-S/D stack including one or more pairs of a first semiconductor layer and a second semiconductor layer;
applying an annealing process to convert the first semiconductor layer to a semiconductor oxide layer;
forming an interlayer dielectric ILD layer over the substrate;
replacing the dummy gate with a high-k/metal gate (HK/MG);
forming a contact opening to expose a portion of the pre-S/D stack, including the semiconductor oxide layer;
selectively removing the exposed semiconductor oxide layer to form a space between each of the first semiconductor layer; and
filling in the contact opening with a metal layer, including filling in the space between each of the first semiconductor layer.

19. The method of claim 18, wherein forming the contact opening includes:
etching the ILD layer through a patterned hard mask and extending to etch the isolation region that a top surface of the recessed isolation region is same or above a top surface of the semiconductor oxide layer at a bottom of the pre-S/D stack.

20. The method of claim 19, wherein the semiconductor oxide layer at the bottom of the pre-S/D stack remain intact during selective removing the other semiconductor oxide layer.

21. The method of claim 18, further comprising:
more than one pre-S/D stacks are exposed in the contact opening; and
filling in the contact opening with the metal layer, including filling in a space between each of pre-S/D stacks with in the contact opening.

* * * * *